United States Patent
Ikeda

(10) Patent No.: US 11,164,617 B1
(45) Date of Patent: Nov. 2, 2021

(54) MEMORY SYSTEM AND OPERATING METHOD THEREOF

(71) Applicant: Winbond Electronics Corp., Taichung (TW)

(72) Inventor: Hitoshi Ikeda, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/919,057

(22) Filed: Jul. 1, 2020

(51) Int. Cl.
*G11C 11/406* (2006.01)
*G11C 11/4076* (2006.01)
*G11C 11/409* (2006.01)
*G11C 5/02* (2006.01)
*G11C 11/4074* (2006.01)

(52) U.S. Cl.
CPC ........ *G11C 11/40615* (2013.01); *G11C 5/025* (2013.01); *G11C 11/409* (2013.01); *G11C 11/4074* (2013.01); *G11C 11/4076* (2013.01); *G11C 2207/2272* (2013.01)

(58) Field of Classification Search
None
See application file for complete search history.

(56) References Cited

U.S. PATENT DOCUMENTS

| | | | |
|---|---|---|---|
| 7,872,936 B2 | 1/2011 | Blankenship | |
| 10,365,842 B2 | 7/2019 | Sauber et al. | |
| 2005/0097276 A1 | 5/2005 | Lu et al. | |
| 2020/0273504 A1* | 8/2020 | Mori | G11C 7/22 |

FOREIGN PATENT DOCUMENTS

| | | |
|---|---|---|
| CN | 101040450 | 9/2007 |
| TW | I647568 | 1/2019 |

OTHER PUBLICATIONS

"Office Action of Taiwan Counterpart Application", dated Dec. 8, 2020, pp. 1-5.

* cited by examiner

*Primary Examiner* — James G Norman
(74) *Attorney, Agent, or Firm* — JCIPRNET

(57) ABSTRACT

A memory system and an operating method thereof are provided. The memory system includes a plurality of pseudo static random access memory chips and a memory controller. The pseudo static random access memory chips are coupled to each other. When receiving an action command, each of the pseudo static random access memory chips determines whether a refresh collision occurs in itself, and generates a collision signal accordingly. The memory controller controls the pseudo static random access memory chips according to the collision signal. All of the pseudo static random access memory chips share their respective collision signals to perform a same latency synchronously.

10 Claims, 6 Drawing Sheets

MEMORY SYSTEM AND OPERATING METHOD THEREOF

BACKGROUND

Technical Field

The disclosure relates to a memory system, and more particularly, to a memory system applicable to a pseudo static random access memory chip, and an operating method thereof.

Description of Related Art

A pseudo static random access memory has the advantages of large capacity and low cost, but it is required to periodically perform refresh operations. In order to avoid the impact of refresh collisions, an existing pseudo static random access memory has a variable latency time (VL) mode. The length of a latency in the variable latency time (VL) mode depends on whether there is a refresh collision with a write operation or a read operation. A long latency is adopted when a refresh collision occurs, and a short latency is adopted when no refresh collision occurs. The long latency time is, for example, twice the short latency time.

In order to reduce the size of an electronic device, multi-chip package (MCP) has become one of the inevitable trends for future development. Under the architecture of the multi-chip package, when one pseudo static random access memory chip has a refresh collision, other pseudo static random access memory chips do not necessarily have a refresh collision at the same time, and the latency time applicable to them may be different. Since it is difficult to adjust the latency time in real time, the operational difficulty increases. Therefore, how to design a pseudo static random access memory chip for multi-chip package has become an important issue.

SUMMARY

The invention provides a memory system and an operating method thereof, which may share information about a refresh collision to all memory chips to perform a same latency synchronously.

The memory system of the invention includes a plurality of pseudo static random access memory chips and a memory controller. The pseudo static random access memory chips are coupled to each other. When receiving an action command, each of the pseudo static random access memory chips determines whether a refresh collision occurs in itself, and generates a collision signal accordingly. The memory controller controls the pseudo static random access memory chips according to the collision signal. All of the pseudo static random access memory chips share their respective collision signals to perform the same latency synchronously.

The operating method of a memory system of the invention is applicable to a memory system which includes a plurality of pseudo static random access memory chips. The method includes: receiving an action command; determining whether a refresh collision occurs, and generating a collision signal accordingly; and sharing the collision signal to all of the pseudo static random access memory chips to perform the same latency synchronously.

Based on the above, in the memory system of the invention, all memory chips may share their respective collision information (collision signals). When a refresh collision occurs in at least one memory chip, a latency time may be set to a long latency. When all the memory chips have no refresh collisions, the latency time may be set to a short latency. Since all the memory chips have a same latency time, a variable latency time mode may be used under the architecture of multi-chip package, and the latency time may be adjusted in real time to increase an execution speed of the memory chips.

DESCRIPTION OF THE EMBODIMENTS

Figure 1:
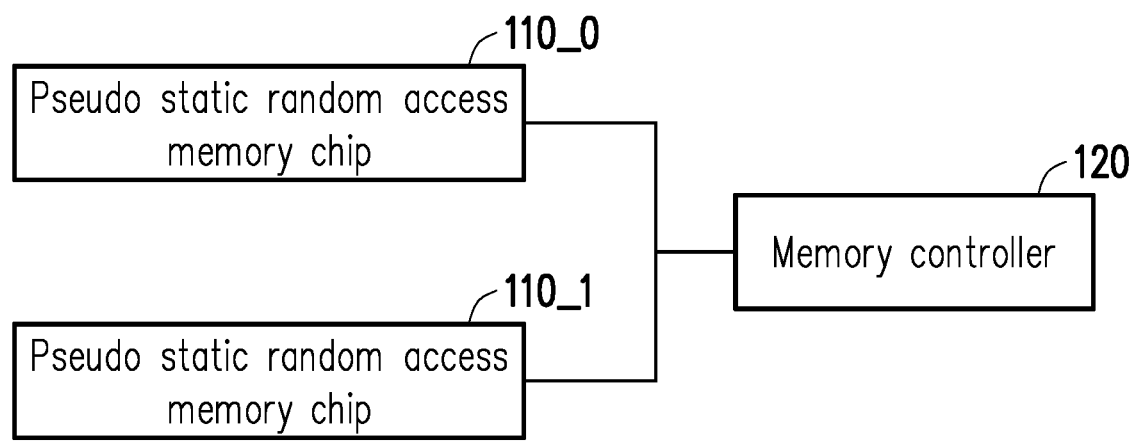
FIG. 1 illustrates a schematic block diagram of a memory system according to an embodiment of the invention.

Referring to FIG. 1, FIG. 1 illustrates a schematic block diagram of a memory system according to an embodiment of the invention. A memory system 100 includes a plurality of pseudo static random access memory chips (for example, pseudo static random access memory chips 110_0 and 110_1) and a memory controller 120.

The pseudo static random access memory chips 110_0 and 110_1 are, for example, pseudo static random access memory chips configured using a multi-chip package technology. The pseudo static random access memory chips 110_0 and 110_1 are coupled to each other. In the present embodiment, when each of the pseudo static random access memory chips 110_0 and 110_1 receives an action command ACMD, each of the pseudo static random access memory chips 110_0 and 110_1 determines whether a refresh collision occurs in itself, and generates a collision signal accordingly.

The memory controller 120 is coupled to the pseudo static random access memory chips 110_0 and 110_1. The memory controller 120 may control the pseudo static random access memory chips 110_0 and 110_1 according to the collision signal. For example, when performing a write operation or a read operation, the memory controller 120 may appropriately adjust actions of the pseudo static random access memory chips 110_0 and 110_1 according to the collision signals from the access memory chips 110_0 and 110_1 to smoothly perform the write operation or the read operation while taking the reliability of data into consideration.

In addition, in the present embodiment, the pseudo static random access memory chips 110_0 and 110_1 may share their respective collision signals to perform a same latency synchronously. For example, when a refresh collision occurs in the pseudo static random access memory chip 110_0, the pseudo static random access memory chip 110_0 generates a corresponding collision signal. Since pins transmitting the collision signals in the pseudo static random access memory chips 110_0 and 110_1 are coupled to each other, the pseudo static random access memory chip 110_1 may set its own latency time according to the received collision signal from the pseudo static random access memory chip 110_0 to perform the same latency with the pseudo static random access memory chip 110_0 synchronously.

In the present embodiment, the memory controller 120 may be a logic circuit composed of a plurality of logic gates, or a central processing unit (CPU), a programmable general-purpose or special-purpose microprocessor, a digital signal processor (DSP), a programmable controller, an application-specific integrated circuit (ASIC), a programmable logic device (PLD), other similar devices, or a combination of these devices. The embodiments of the invention are not limited thereto.

It should be noted that although the present embodiment is described with the memory system 100 including two pseudo static random access memory chips 110_0 and 110_1, the number of the above chips is not limited in the invention. Those skilled in the art may analogize the number of pseudo static random access memory chips to plural with reference to the teaching of the present embodiment according to their actual demands.

The memory system 100 in the present solution may be configured in two modes, for example, an address expansion type and an IO expansion type. The above two modes will be illustrated below.

Figure 2:
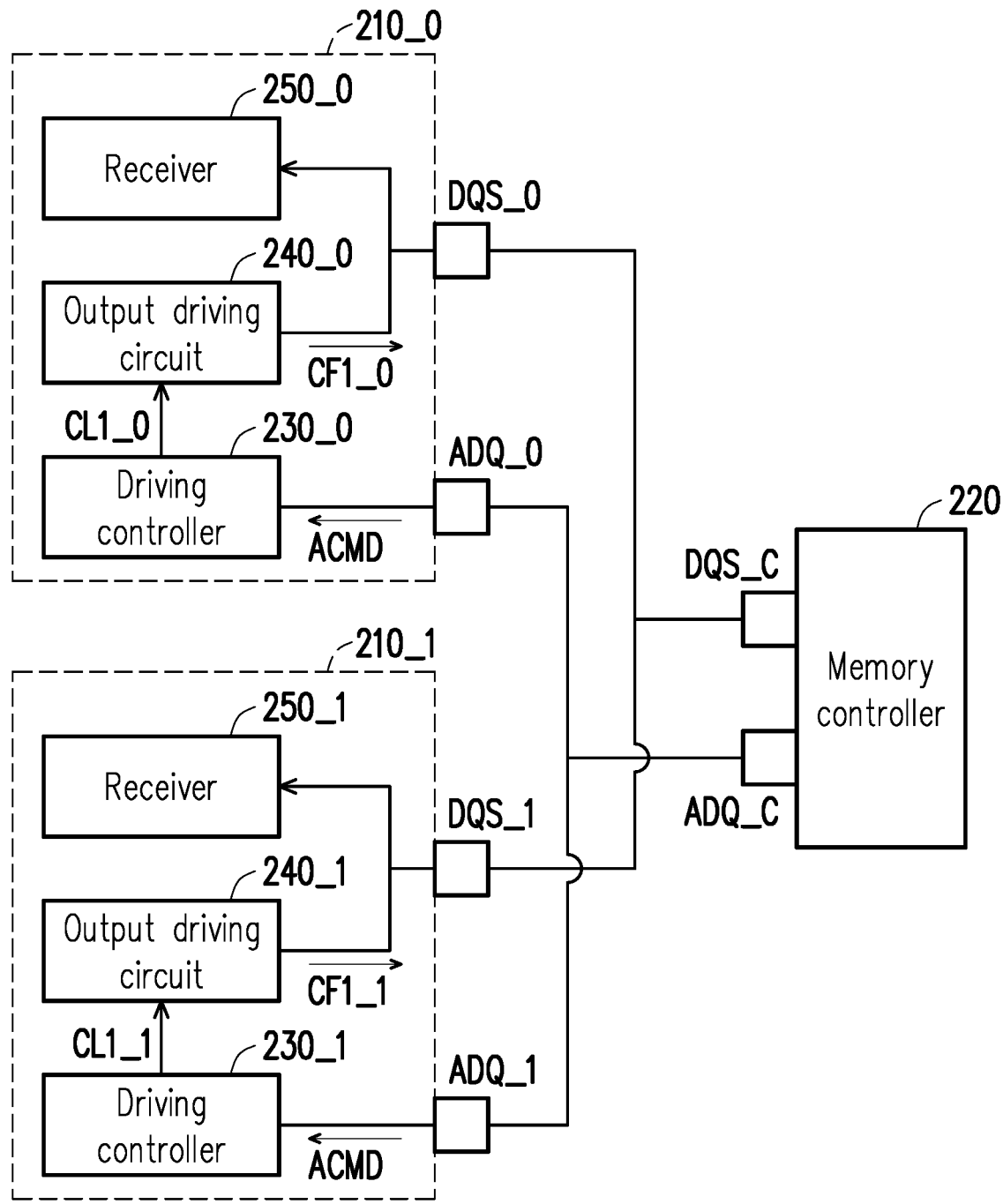
FIG. 2 illustrates a schematic circuit diagram of a memory system according to an embodiment of the invention.

FIG. 2 illustrates a schematic circuit diagram of a memory system according to an embodiment of the invention. The memory system 200 is applicable to an address expansion type configuration mode. As shown in FIG. 2, the memory system 200 includes a plurality of pseudo static random access memory chips (for example, pseudo static random access memory chips 210_0 and 210_1) and a memory controller 220. The number of the pseudo static random access memory chips is not limited in the invention.

As shown in FIG. 2, the pseudo static random access memory chip 210_0 includes a strobe pin DQS_0, a data pin ADQ_0, a driving controller 230_0, an output driving circuit 240_0, and a receiver 250_0. The pseudo static random access memory chip 210_1 includes a strobe pin DQS_1, a data pin ADQ_1, a driving controller 230_1, an output driving circuit 240_1, and a receiver 250_1. The strobe pin DQS_0 of the pseudo static random access memory chip 210_0 is coupled to strobe pins of all other pseudo static random access memory chips (for example, the strobe pin DQS_1 of the pseudo static random access memory chip 210_1) and a strobe pin DQS_C of the memory controller 220. The data pin ADQ_0 of the pseudo static random access memory chip 210_0 is coupled to data pins of all other pseudo static random access memory chips (for example, the data pin ADQ_1 of the pseudo static random access memory chip 210_1) and a data pin ADQ_C of the memory controller 220.

The pseudo static random access memory chip 210_0 is taken as an example for description. The driving controller 230_0 may receive an action command ACMD from the memory controller 220 through the data pin ADQ_0.

For example, the pseudo static random access memory chip 210_0 may be, for example, a 256M-bit, 8-IO pseudo static random access memory chip. The action command ACMD sent by the memory controller 220 may include 8-bit command information, 25-bit address information A<24:0>, and 1-bit chip information A<25>. When the chip information A<25> is 0 (low logic level), it means that the memory controller 220 selects the pseudo static random access memory chip 210_0. When the chip information A<25> is 1 (high logic level), it means that the memory controller 220 selects the pseudo static random access memory chip 210_1.

In this way, when the pseudo static random access memory chip 210_0 receives the action command ACMD, the driving controller 230_0 may, for example, determine whether to act correspondingly according to the chip information A<25>.

Then, when the pseudo static random access memory chip 210_0 is selected, the driving controller 230_0 may determine whether a refresh collision occurs in the pseudo static random access memory chip 210_0 to which it belongs according to a time point and content of receiving the action command ACMD, and generate a control signal CL1_0 accordingly.

The output driving circuit 240_0 is coupled to the strobe pin DQS_0 and the driving controller 230_0. The output driving circuit 240_0 provides a collision signal CF1_0 to the strobe pin DQS_0 according to the control signal CL1_0.

The receiver 250_0 is coupled to the strobe pin DQS_0. The receiver 250_0 may determine a latency time according to the collision signal CF1_0 to perform latency on the pseudo static random access memory chip 210_0 to which it belongs. In the present embodiment, the receiver 250_0 may be, for example, a logic circuit including a counter and a plurality of logic gates. The embodiments of the invention are not limited thereto.

An operation mode of the pseudo static random access memory chip 210_1 is substantially the same as that of the pseudo static random access memory chip 210_0, so the operation modes of actions and signals (including a control signal CL1_1 and a collision signal CF1_1) thereof may refer to the pseudo static random access memory chip 210_0.

Figure 3:
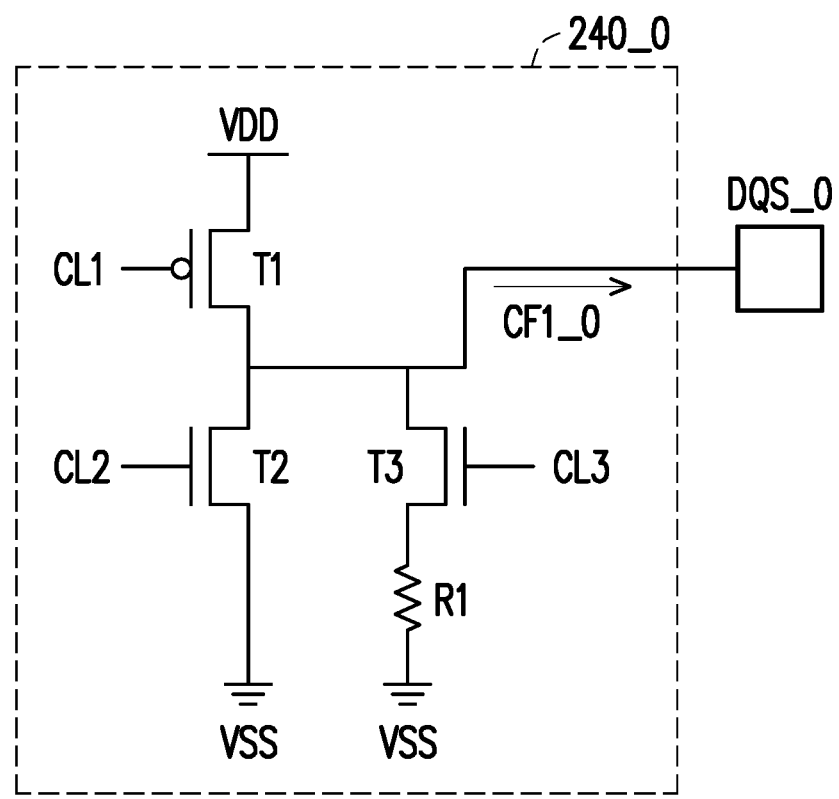
FIG. 3 illustrates a schematic structure diagram of an output driving circuit according to an embodiment of the invention.

The detailed circuit structure and operation mode of the output driving circuit 240_0 will be illustrated below. FIG. 3 illustrates a schematic structure diagram of an output driving circuit according to an embodiment of the invention. The output driving circuit 240_0 includes a transistor T1, a transistor T2, a transistor T3, and a resistor R1. In the present embodiment, the control signal CL1_0 includes sub-control signals CL1, CL2, and CL3, which are used to control the transistor T1, the transistor T2, and the transistor T3, respectively.

In FIG. 3, a first terminal of the transistor T1 receives a driving voltage VDD. A second terminal of the transistor T1 is coupled to the strobe pin DQS_0. A control terminal of the transistor T1 receives the sub-control signal CL1.

A first terminal of the transistor T2 is coupled to the second terminal of the transistor T1. A second terminal of the transistor T2 receives a grounding voltage VSS. A control terminal of the transistor T2 receives the sub-control signal CL2.

A first terminal of the transistor T3 is coupled to the second terminal of the transistor T1. A control terminal of the transistor T3 receives the sub-control signal CL3. A first terminal of the resistor R1 is coupled to the second terminal of the transistor T3, and a second terminal of the resistor R1 receives the grounding voltage VSS.

As shown in FIG. 3, the transistor T1 is a P-type transistor, and the transistors T2 and T3 are N-type transistors. The operation modes of the control signals CL1-CL3 are as follows:

TABLE 1

| | | Receive action command ACMD | | | |
|---|---|---|---|---|---|
| | | Refresh collision | No refresh collision | Read | Write | Other |
| CL1 | | H | L | V | H | H |
| CL2 | | L | L | V | L | L |
| CL3 | 240_0 | H | H | L | L | L |
| | Other | L | L | L | L | L |
| Receiver | | Enabled | Enabled | Disabled | Enabled | Disabled |

In Table 1, H is a high logic level and L is a low logic level. V is a high logic level or a low logic level. When H is output to the strobe pin DQS_0, CL1 &CL2=L. When L is output to the strobe pin DQS_0, CL1&CL2=H.

Referring to FIG. 3 and Table 1 at the same time, in the operation of a circuit, when the driving controller 230_0 receives an action command ACMD and determines that a refresh collision does not occur in the pseudo static random access memory chip 210_0 to which it belongs, the control signal CL1 is a high logic level (H), the control signal CL2 is a low logic level (L), and the control signal CL3 in the output driving circuit 240_0 is a high logic level (H). At this moment, the transistors T1 and T2 are turned off in the output driving circuit 240_0, so the output driving circuit 240_0 does not drive the logic level of the strobe pin DQS_0. In the case where no refresh collision occurs in all the pseudo static random access memory chips 210_0 and 210_1, since only the transistor T3 in the output driving circuit 240_0 is turned on, the strobe pin DQS_0 will be pulled down to the grounding voltage VSS to output the corresponding collision signal CF1_0 to the strobe pin DQS_0.

On the other hand, when the driving controller 230_0 receives an action command ACMD and determines that a refresh collision occurs in the pseudo static random access memory chip 210_0 to which it belongs, the control signal CL1 is a low logic level (L), the control signal CL2 is a low logic level (L), and the control signal CL3 in the output driving circuit 240_0 is a high logic level (H). At this moment, in the output driving circuit 240_0, the transistor T1 is turned on, and the transistor T2 is turned off. Therefore, the output driving circuit 240_0 will pull up the logic level of the strobe pin DQS_0 to output the corresponding collision signal CF1_0 to the strobe pin DQS_0.

Through the above operation mode, in the plurality of pseudo static random access memory chips (for example, pseudo static random access memory chips 210_0 and 210_1) of the present solution, chips having refresh collisions may drive strobe pins to a high logic level, and chips having no refresh collisions may not drive strobe pins.

Moreover, such an operation mode is not easy to generate bus fights on the pins. When the strobe pin DQS_0 is driven to a high logic level, a DC current will flow through the transistor T3 and the resistor R1. This current depends on a resistance value of the resistor R1. For example, when the resistor R1 is 10K ohms and VDD is 2.0 volts, the DC current flowing through the transistor T3 is 200 u amps, which is less than an activated current of the pseudo static random access memory chip.

As shown in Table 1, during the period when the driving controller 230_0 receives the action command ACMD, no matter whether there is a refresh collision, only the control signal CL3 in the output driving circuit 240_0 is a high logic level (H), and the control signals CL3 in other output driving circuits are all low logic levels (L). Such an operation mode is to turn on the transistor T3 in the output driving circuit 240_0 in the case where no refresh collision occurs in all the pseudo static random access memory chips 210_0 and 210_1, and to accordingly pull down the strobe pins DQS_0 and DQS_1 to the grounding voltage VSS, thereby preventing the strobe pins DQS_0 and DQS_1 from being in a high impedance state.

In addition, during the period when the driving controller 230_0 receives the action command ACMD, the receiver 250_0 is in an enabled state. After the output driving circuit 240_0 outputs the corresponding collision signal CF1_0 to the strobe pin DQS_0, the receiver 250_0 may determine a latency time according to the collision signal CF1_0.

Furthermore, since the strobe pins of all the pseudo static random access memory chips 210_0 and 210_1 are coupled to each other, all the pseudo static random access memory chips 210_0 and 210_1 may set a same latency time synchronously. In the case where no refresh collision occurs in all the pseudo static random access memory chips 210_0 and 210_1, a shorter latency time may be set synchronously. In this way, under the architecture of the invention, burst reading and writing across memory chips may be achieved.

Moreover, as shown in Table 1, the receiver may be disabled during the read operation. During the write operation, the strobe pin may be used to generate a data mask signal, so the output driving circuit is disabled and the receiver is enabled.

Figure 4:
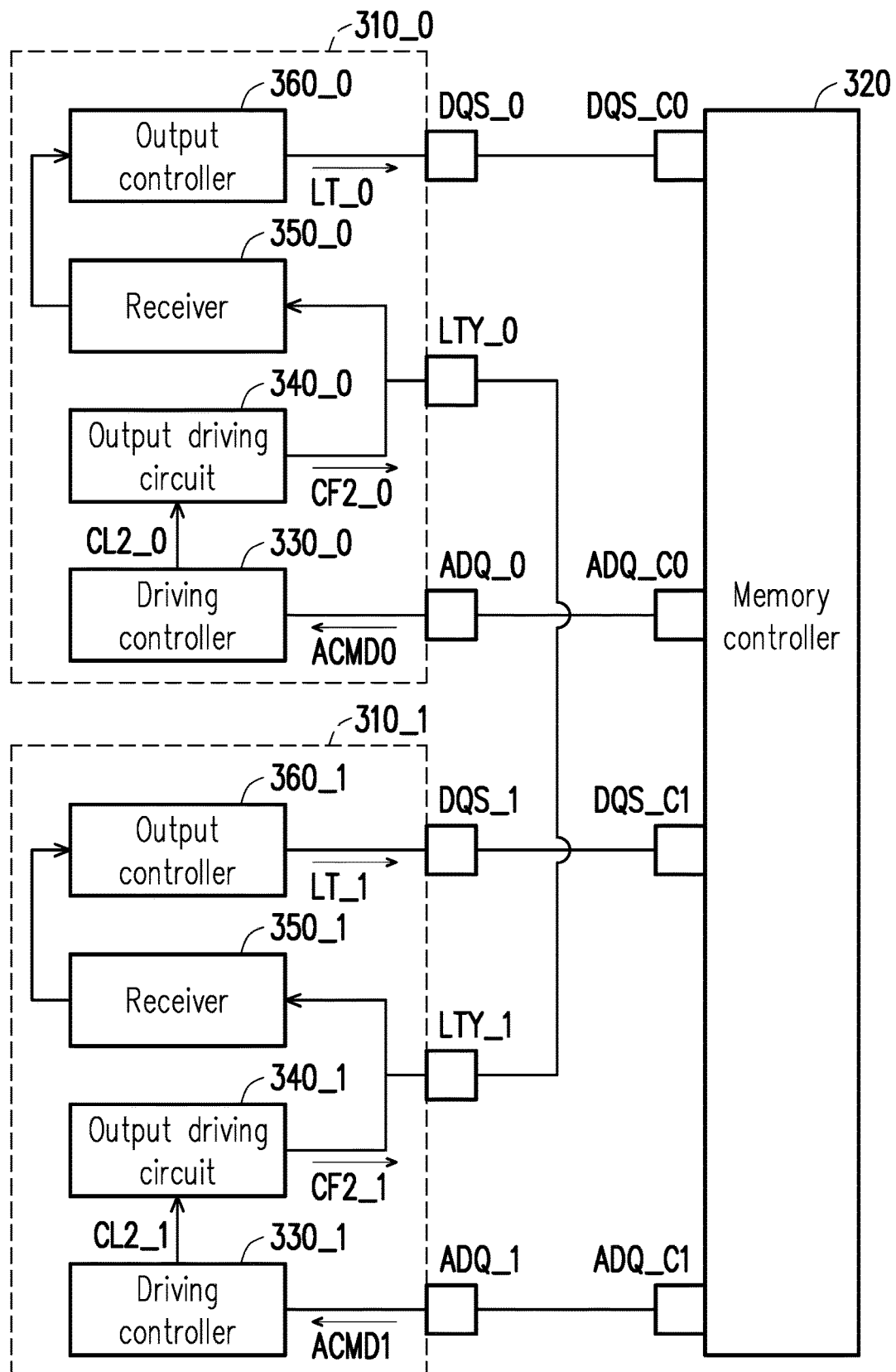
FIG. 4 illustrates a schematic circuit diagram of a memory system according to another embodiment of the invention.

FIG. 4 illustrates a schematic circuit diagram of a memory system according to another embodiment of the invention. The memory system 300 is applicable to an IO expansion type configuration mode. As shown in FIG. 4, the memory system 300 includes a plurality of pseudo static random access memory chips (for example, pseudo static random access memory chips 310_0 and 310_1) and a memory controller 320. The number of the pseudo static random access memory chips is not limited in the invention.

As shown in FIG. 4, the pseudo static random access memory chip 310_0 includes a strobe pin DQS_0, a data pin ADQ_0, a latency pin LTY_0, a driving controller 330_0, an output driving circuit 340_0, a receiver 350_0, and an output controller 360_0. The pseudo static random access memory chip 310_1 includes a strobe pin DQS_1, a data pin ADQ_1, a latency pin LTY_1, a driving controller 330_1, an output driving circuit 340_1, a receiver 350_1, and an output controller 360_1. The strobe pin DQS_0 and the data pin ADQ_0 of the pseudo static random access memory chip 310_0 are coupled to a strobe pin DQS_C0 and a data pin ADQ_C0 of the memory controller 320, respectively. The strobe pin DQS_1 and the data pin ADQ_1 of the pseudo static random access memory chip 310_1 are coupled to a strobe pin DQS_C1 and a data pin ADQ_C1 of the memory controller 320, respectively. The latency pin LTY_0 of the pseudo static random access memory chip 310_0 is coupled to latency pins of all other pseudo static random access memory chips (for example, the latency pin LTY_1 of the pseudo static random access memory chip 310_1).

The pseudo static random access memory chip 310_0 is taken as an example for description. The driving controller 330_0 may receive an action command ACMD0 from the memory controller 320 through the data pin ADQ_0.

For example, the pseudo static random access memory chip 310_0 may be, for example, a 256M-bit, 8-IO pseudo static random access memory chip. The difference from the previous embodiment is that the data pin ADQ_C0 and the data pin ADQ_C1 of the memory controller 320 are coupled to the data pin ADQ_0 of the pseudo static random access memory chip 310_0 and the data pin ADQ_1 of the pseudo static random access memory chip 310_1, respectively. When the pseudo static random access memory chip 310_0 is to be selected, the memory controller 320 may send the action command ACMD0 to the pseudo static random access memory chip 310_0 through the data pin ADQ_C0. In IO expansion type multi-chip package, the memory controller 320 simultaneously sends the same command to all the pseudo static random access memory chips 310_0 and 310_1.

Then, when the pseudo static random access memory chip 310_0 is selected, the driving controller 330_0 may determine whether a refresh collision occurs in the pseudo static random access memory chip 310_0 to which it belongs according to a time point and content of receiving the action command ACMD0, and generate a control signal CL2_0 accordingly.

The output driving circuit 340_0 is coupled to the latency pin LTY_0 and the driving controller 330_0. The output driving circuit 340_0 provides a collision signal CF2_0 to the latency pin LTY_0 according to the control signal CL2_0.

The receiver 350_0 is coupled to the latency pin LTY_0. The receiver 350_0 may determine a latency time according to the collision signal CF2_0 to perform latency on the pseudo static random access memory chip 310_0 to which it belongs. In the present embodiment, the receiver 350_0 may be, for example, a logic circuit including a counter and a plurality of logic gates. The embodiments of the invention are not limited thereto.

The output controller 360_0 is coupled to the receiver 350_0 and the strobe pin DQS_0. The output controller 360_0 provides a latency signal LT_0 to the strobe pin DQS_0 according to the determined latency time. In this way, the memory controller 320 may obtain latency information of the pseudo static random access memory chip 310_0, so as to appropriately control the pseudo static random access memory chip 310_0. In the present embodiment, the output controller 360_0 may be a logic circuit composed of a plurality of logic gates. The embodiments of the invention are not limited thereto.

In addition, in an embodiment, an off-chip driver (OCD) may also be bridged between the output controller 360_0 and the strobe pin DQS_0. The off-chip driver may be used to adjust the voltage of the strobe pin DQS_0 to compensate pull-up and pull-down resistance values to ensure the integrity and reliability of signals.

An operation mode of the pseudo static random access memory chip 310_1 is substantially the same as that of the pseudo static random access memory chip 310_0, so the operation modes of actions and signals (including an action command ACMD1, a control signal CL2_1, a collision signal CF2_1, and a latency signal LT_1) thereof may refer to the pseudo static random access memory chip 310_0.

Figure 5:
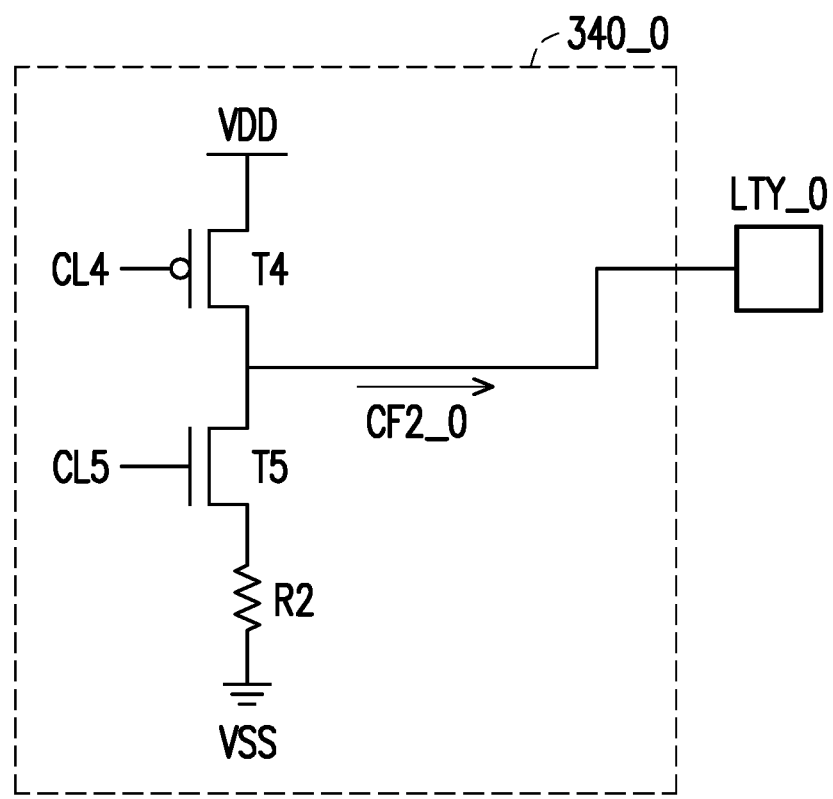
FIG. 5 illustrates a schematic structure diagram of an output driving circuit according to another embodiment of the invention.

The detailed circuit structure and operation mode of the output driving circuit 340_0 will be illustrated below. FIG. 5 illustrates a schematic structure diagram of an output driving circuit according to another embodiment of the invention. The output driving circuit 340_0 includes a transistor T4, a transistor T5, and a resistor R2. In the present embodiment, the control signal CL2_0 includes sub-control signals CL4 and CL5, which are used to control the transistor T4 and the transistor T5, respectively.

In FIG. 5, a first terminal of the transistor T4 receives a driving voltage VDD. A second terminal of the transistor T4 is coupled to the latency pin LTY_0. A control terminal of the transistor T4 receives the sub-control signal CL4.

A first terminal of the transistor T5 is coupled to the second terminal of the transistor T4. A control terminal of the transistor T5 receives the sub-control signal CL5. A first terminal of the resistor R2 is coupled to the second terminal of the transistor T5, and a second terminal of the resistor R2 receives a grounding voltage VSS.

As shown in FIG. 5, the transistor T4 is a P-type transistor, and the transistor T5 is an N-type transistor. The operation modes of the control signals CL4 and CL5 are as follows:

TABLE 2

| | | Receive action command ACMD | | |
|---|---|---|---|---|
| | | No refresh collision | Refresh collision | Other |
| CL4 | | H | L | H |
| CL5 | 340_0 | H | H | H |
| | Other | L | L | L |
| Receiver | | Enabled | Enabled | Disabled |

In Table 2, H is a high logic level and L is a low logic level.

Referring to FIG. 5 and Table 2 at the same time, in the operation of a circuit, when the driving controller 330_0 receives an action command ACMD0 and determines that a refresh collision does not occur in the pseudo static random access memory chip 310_0 to which it belongs, the control signal CL4 is a high logic level (H), and the control signal CL5 in the output driving circuit 340_0 is a high logic level (H). At this moment, the transistor T4 is turned off in the output driving circuit 340_0, so the output driving circuit 340_0 does not drive the logic level of the latency pin LTY_0. In the case where no refresh collision occurs in all the pseudo static random access memory chips 310_0 and 310_1, since only the transistor T5 in the output driving circuit 340_0 is turned on, the latency pin LTY_0 will be pulled down to the grounding voltage VSS to output the corresponding collision signal CF2_0 to the latency pin LTY_0.

On the other hand, when the driving controller 330_0 receives an action command ACMD0 and determines that a refresh collision occurs in the pseudo static random access memory chip 310_0 to which it belongs, the control signal CL4 is a low logic level (L), and the control signal CL5 in the output driving circuit 340_0 is a high logic level (H). At this moment, the transistor T4 is turned on in the output driving circuit 340_0. Therefore, the output driving circuit 340_0 will pull up the logic level of the latency pin LTY_0 to output the corresponding collision signal CF2_0 to the latency pin LTY_0.

Through the above operation mode, in the plurality of pseudo static random access memory chips (for example, pseudo static random access memory chips 310_0 and 310_1) of the present solution, chips having refresh collisions may drive latency pins to a high logic level, and chips having no refresh collisions may not drive latency pins.

Moreover, such an operation mode is not easy to generate bus fights on the pins. When the latency pin LTY_0 is driven to a high logic level, a DC current will flow through the transistor T5 and the resistor R2. This current depends on a resistance value of the resistor R2. For example, when the resistor R2 is 10K ohms and VDD is 2.0 volts, the DC current flowing through the transistor T5 is 200 u amps, which is less than an activated current of the pseudo static random access memory chip.

As shown in Table 2, during the period when the driving controller 330_0 receives the action command ACMD0, no matter whether there is a refresh collision, only the control signal CL5 in the output driving circuit 340_0 is a high logic level (H), and the control signals CL5 in other output driving circuits are all low logic levels (L). Such an operation mode is to turn on the transistor T5 in the output driving circuit 340_0 in the case where no refresh collision occurs in all the pseudo static random access memory chips 310_0 and 310_1, and to accordingly pull down the latency pins LYT_0 and LYT_1 to the grounding voltage VSS, thereby preventing the latency pins LYT_0 and LYT_1 from being in a high impedance state.

In addition, during the period when the driving controller 330_0 receives the action command ACMD0, the receiver 350_0 is in an enabled state. After the output driving circuit 340_0 outputs the corresponding collision signal CF2_0 to the latency pin LYT_0, the receiver 350_0 may determine a latency time according to the collision signal CF2_0.

Furthermore, since the latency pins of all the pseudo static random access memory chips 310_0 and 310_1 are coupled to each other, all the pseudo static random access memory chips 310_0 and 310_1 may set the same latency time synchronously. In the case where no refresh collision occurs in all the pseudo static random access memory chips 310_0 and 310_1, a shorter latency time may be set synchronously.

Figure 6:
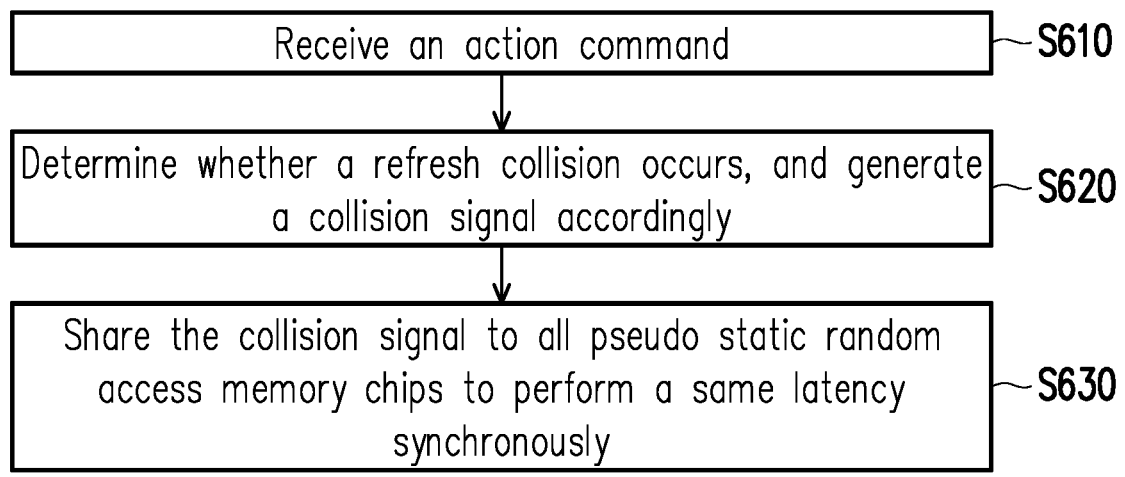
FIG. 6 shows a flowchart of an operating method of a memory system according to an embodiment of the invention.

Referring below to FIG. 6, FIG. 6 shows a flowchart of an operating method of a memory system according to an embodiment of the invention. The memory system of the present embodiment includes a plurality of pseudo static random access memory chips. In step S610, an action command is received. Then, in step S620, it is determined whether a refresh collision occurs, and a collision signal is generated accordingly. Finally, in step S630, the collision signal is shared to all of the pseudo static random access memory chips to perform the same latency synchronously. Regarding the implementation details of the steps of the operating method of the memory system in FIG. 6 above, there are detailed descriptions in the foregoing embodiments and implementations. The descriptions thereof are omitted below.

Based on the foregoing, in the memory system of the invention, all memory chips may share their own collision information (collision signals). Since all the memory chips have the same latency time, a variable latency time mode may be used under the architecture of multi-chip package, and the latency time may be adjusted in real time to increase an execution speed of the memory chips and reduce the difficulty in control and operation.

What is claimed is:

1. A memory system comprising:
a plurality of pseudo static random access memory chips coupled to each other, wherein when receiving an action command, each of the plurality of pseudo static random access memory chips determines whether a refresh collision occurs in itself, and generates a collision signal accordingly; and
a memory controller coupled to the plurality of pseudo static random access memory chips, and controlling the plurality of pseudo static random access memory chips according to the collision signal,
wherein all of the plurality of pseudo static random access memory chips share their respective collision signals to perform a same latency synchronously,
wherein when the refresh collision occurs in one of the plurality of pseudo static random access memory chips, another one of the plurality of pseudo static random access memory chips sets its own latency time according to the received collision signal from the one of the plurality of pseudo static random access memory chips.

2. The memory system according to claim 1, wherein each of the plurality of pseudo static random access memory chips comprises:
a strobe pin coupled to strobe pins of the memory controller and all of the other pseudo static random access memory chips;
a data pin coupled to data pins of the memory controller and all of the other pseudo static random access memory chips;
a driving controller receiving the action command from the memory controller through the data pin, determining whether the refresh collision occurs in the pseudo static random access memory chip to which the driving controller belongs according to a time point and content of receiving the action command, and generating a control signal accordingly; and
an output driving circuit coupled to the strobe pin and the driving controller, and providing the collision signal to the strobe pin according to the control signal.

3. The memory system according to claim 2, wherein the control signal comprises a first sub-control signal, a second sub-control signal, and a third sub-control signal, and the output driving circuit comprises:
a first transistor, wherein a first terminal of the first transistor receives a driving voltage, a second terminal of the first transistor is coupled to the strobe pin, and a control terminal of the first transistor receives the first sub-control signal;
a second transistor, wherein a first terminal of the second transistor is coupled to the second terminal of the first transistor, a second terminal of the second transistor receives a grounding voltage, and a control terminal of the second transistor receives the second sub-control signal;
a third transistor, wherein a first terminal of the third transistor is coupled to the second terminal of the first transistor, and a control terminal of the third transistor receives the third sub-control signal; and
a resistor, wherein a first terminal of the resistor is coupled to a second terminal of the third transistor, and a second terminal of the resistor receives the grounding voltage.

4. The memory system according to claim 3, wherein the first transistor is a P-type transistor, and the second transistor and the third transistor are N-type transistors.

5. The memory system according to claim 2, wherein each of the plurality of pseudo static random access memory chips further comprises:
a receiver coupled to the strobe pin, and determining the latency time according to the collision signal to perform latency on the pseudo static random access memory chip to which the receiver belongs.

6. A memory system comprising:
of pseudo static random access memory chins coupled wherein when receiving an action command, each of the plurality of pseudo static random access memory chips determines whether a refresh collision occurs in itself, and generates a collision signal accordingly; and
a memory controller coupled to the plurality of pseudo static random access memory chips, and controlling the plurality of pseudo static random access memory chips according to the collision signal,
wherein all of the plurality of pseudo static random access memory chips share their respective collision signals to perform a same latency synchronously, wherein each of the plurality of pseudo static random access memory chips comprises:

a strobe pin coupled to the memory controller;

a data pin coupled to the memory controller;

a latency pin coupled to latency pins of all of the other pseudo static random access memory chips;

a driving controller receiving the action command from the memory controller through the data pin, determining whether the refresh collision occurs in the pseudo static random access memory chip to which the driving controller belongs according to a time point and content of receiving the action command, and generating a control signal accordingly; and an output driving circuit coupled to the latency pin and the driving controller, and providing the collision signal to the latency pin according to the control signal.

7. The memory system according to claim 6, wherein the control signal comprises a first sub-control signal and a second sub-control signal, and the output driving circuit comprises:

a first transistor, wherein a first terminal of the first transistor receives a driving voltage, a second terminal of the first transistor is coupled to the latency pin, and a control terminal of the first transistor receives the first sub-control signal;

a second transistor, wherein a first terminal of the second transistor is coupled to the second terminal of the first transistor, and a control terminal of the second transistor receives the second sub-control signal; and a resistor, wherein a first terminal of the resistor is coupled to a second terminal of the second transistor, and a second terminal of the resistor receives a grounding voltage.

8. The memory system according to claim 7, wherein the first transistor is a P-type transistor, and the second transistor is an N-type transistor.

9. The memory system according to claim 6, wherein each of the plurality of pseudo static random access memory chips further comprises:

a receiver coupled to the latency pin, and determining a latency time according to the collision signal; and an output controller coupled to the receiver and the strobe pin, and providing a latency signal to the strobe pin according to the determined latency time.

10. An operating method of a memory system, the memory system comprising a plurality of pseudo static random access memory chips, the operating method comprising:

receiving an action command;

determining whether a refresh collision occurs, and generating a collision signal accordingly; and sharing the collision signal to all of the plurality of pseudo static random access memory chips to perform a same latency synchronously, wherein when the refresh collision occurs in one of the plurality of pseudo static random access memory chips, another one of the plurality of pseudo static random access memory chips set its own latency time according to the received collision signal from the one of the plurality of pseudo static random access memory chips.

* * * * *